US012812971B2

(12) United States Patent
Reboh et al.

(10) Patent No.: US 12,812,971 B2
(45) Date of Patent: Nov. 24, 2026

(54) STACKED FIELD EFFECT TRANSISTOR HYBRID GATE CUT

(71) Applicant: International Business Machines Corporation, Armonk, NY (US)

(72) Inventors: Shay Reboh, Guilderland, NY (US); Julien Frougier, Albany, NY (US); Leon Sigal, Monsey, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 18/361,255

(22) Filed: Jul. 28, 2023

(65) Prior Publication Data

US 2025/0040240 A1 Jan. 30, 2025

(51) Int. Cl.

| | |
|---|---|
| ***H10D 84/00*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ......... *H10D 84/856* (2025.01); *H10D 30/014* (2025.01); *H10D 30/43* (2025.01); *H10D 30/6735* (2025.01); *H10D 62/121* (2025.01); *H10D 64/01326* (2026.01);

(Continued)

(58) Field of Classification Search

CPC . H10D 84/0153; H10D 84/856; H10D 84/851

See application file for complete search history.

(56) References Cited

U.S. PATENT DOCUMENTS 10,192,819 B1 1/2019 Chanemougame et al.
10,192,867 B1 1/2019 Frougier et al.

(Continued)

FOREIGN PATENT DOCUMENTS

EP 4033522 A1 7/2022

OTHER PUBLICATIONS

Sacchetto et al., “Fabrication and characterization of vertically stacked gate-all-around Si nanowire FET arrays”, In 2009 Proceedings of the European Solid State Device Research Conference, Sep. 2019, pp. 245-248.

*Primary Examiner* — Reema Patel

(74) *Attorney, Agent, or Firm* — Harrity & Harrity, LLP

(57) ABSTRACT

A semiconductor device including a stacked structure including first vertically stacked channel regions positioned over second vertically stacked channel regions. The first and second vertically stacked channel regions have a mid dielectric layer positioned therebetween. A structure is present having a first portion in electrical communication with the first vertically stacked channel regions and a second portion in electrical communication with the second vertically stacked channel regions. The semiconductor device also includes at least one two-component gate cut structure present adjacent to the gate all around structure. A first component of the two-component gate cut structure in positioned on one side of the mid dielectric layer adjacent to the first portion of the gate structure, and a second component of the two-component gate cut structure is positioned on a second side of the mid dielectric layer adjacent to the second portion of the gate structure.

20 Claims, 11 Drawing Sheets

(51) Int. Cl.

| | |
|---|---|
| ***H10D 64/01*** | (2025.01) |
| ***H10D 84/01*** | (2025.01) |
| ***H10D 84/03*** | (2025.01) |
| ***H10D 84/85*** | (2025.01) |
| ***H10D 88/00*** | (2025.01) |

(52) U.S. Cl.
CPC ....... *H10D 84/0167* (2025.01); *H10D 84/038* (2025.01); *H10D 88/01* (2025.01)

(56) References Cited

U.S. PATENT DOCUMENTS

| | | | | |
|---|---|---|---|---|
| 10,510,622 | B1 | 12/2019 | Frougier et al. | |
| 10,586,860 | B2 | 3/2020 | Shu et al. | |
| 11,532,744 | B2 | 12/2022 | Chen et al. | |
| 2019/0393214 | A1* | 12/2019 | Lilak | B82Y 10/00 |
| 2020/0294998 | A1 | 9/2020 | Lilak et al. | |
| 2022/0157815 | A1* | 5/2022 | Hong | H10D 84/0172 |
| 2022/0181318 | A1* | 6/2022 | Liebmann | H10D 84/0186 |
| 2022/0262915 | A1 | 8/2022 | Su et al. | |
| 2022/0271139 | A1 | 8/2022 | Su et al. | |
| 2022/0392896 | A1 | 12/2022 | Guler et al. | |

* cited by examiner

STACKED FIELD EFFECT TRANSISTOR HYBRID GATE CUT

BACKGROUND

The present disclosure relates to semiconductor devices, and more particularly to semiconductor devices including channel regions integrated within nanosheets.

Modern integrated circuits are made up of literally millions of active devices such as transistors. Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body.

Gate structures in stacked field effect transistors (FETs) are processed using a gate cut process. The gate cut process is in most case performed from the front side of the wafer. With vertically stacked devices, the depth of the cut has become a difficulty, because the critical dimension can be difficult to control under these processing, and the etch processes can introduce residue.

SUMMARY

In one aspect, a semiconductor device is provided including stacked field effect transistors. In one embodiment, the semiconductor device includes a stacked structure including a first vertically stacked channel region positioned over a second vertically stacked channel regions. At least one gate structure is in electrical communication with the first vertically stacked channel regions and the second vertically stacked channel regions. At least one two-component gate cut structure is present adjacent to the gate structure. A first component of the two-component gate cut structure in positioned adjacent to a first portion of the at least one gate structure. A second component of the two-component gate cut structure is positioned adjacent to a second portion of the at least one gate structure.

In another embodiment, a semiconductor device is provided that includes a first transistor device stacked over a second transistor device, wherein a mid dielectric layer is positioned between the first and second transistor devices. The semiconductor device also includes a first transistor side gate cut structure that extends through an entirety of a gate structure for the first transistor device to the mid dielectric layer; and a second transistor gate cut structure that that extends through an entirety of a gate structure for the second transistor device to the mid dielectric layer.

In another embodiment, a method of forming a semiconductor device is described that includes forming a vertical stack of two field effect transistors having a gate structure to channel regions of the two field effect transistors. In some embodiments, a first field effect transistor gate cut is formed from a first side of the vertical stack; and a second field effect transistor gate cut is formed from a second side of the vertical stack, wherein the first and second sides of the vertical stack are opposite one another.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1:
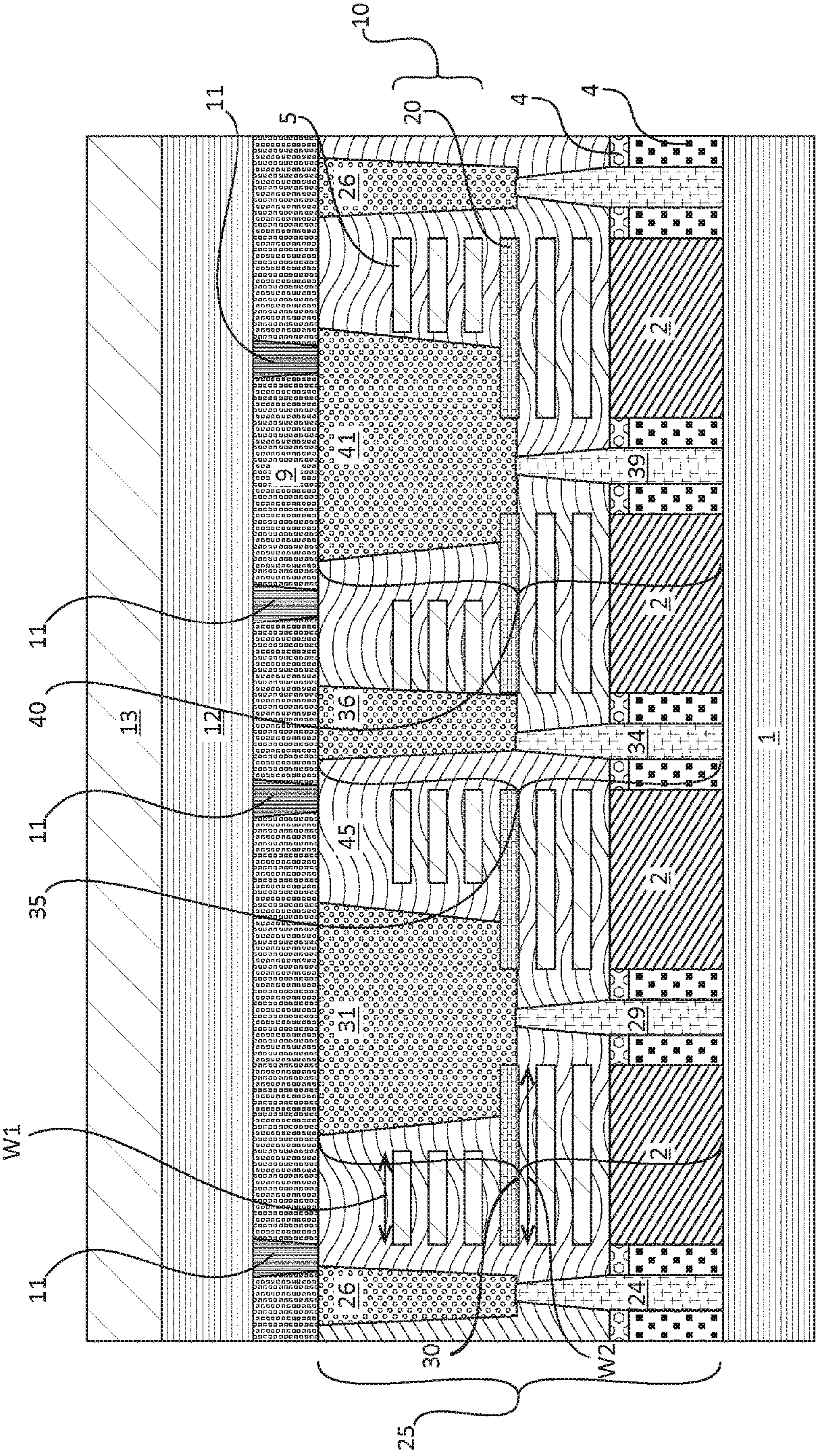
FIG. 1 is a side cross-sectional view of a semiconductor device along a gate length direction that includes a first transistor device stacked over a second transistor device, wherein a mid dielectric layer is positioned between the first and second transistor devices and a hybrid gate cut structure is employed to section the gate structure of the device, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the disclosed structures and methos provide a hybrid gate cut process for stacked field effect transistors (FETs). Prior gate cut processes form the gate cut for stacked field effect transistors (FETs) by etching a trench into the gate structure from the frontside of the substrate (also referred to as a wafer) that supports the structure of the stacked field effect transistors. Some drawbacks of this method of forming a gate structure have been observed that include the trench being very deep. The greater depths of the trench formed by etching can mean that the critical dimension is difficult to control. For example, with such deep gate cut dimensions, assuming a three degree angle for the taper of the etch, the difference in the top and bottom gate extension dimensions can be great than 5 nm, which can result in an 8% increase in the total cell height for the structure including the gate cut. Further, reactive ion etch (RIE) processes can introduce etch residues into the structure when forming gate cuts having such extreme depths than can be needed for device stacks for two field effect transistors (FET) structures. In some embodiments, the hybrid gate cut process of the present disclosure splits forming the gate cut into two different etch steps from opposing sides of the vertical stacked structure of the first and second field effect transistors. This reduces the etch depth for each side of the etch cut. In one example, the method includes forming a stacked field effect transistor (FET) with a mid dielectric layer; and forming a frontside gate cut that extends about to the level of mid dielectric layer. In a following process sequence, the method may continue with forming the middle of the line contact, which is then followed by back end of the line (BEOL) processing. Thereafter, a carrier wafer is bonded to the dielectrics introduced by the BEOL processes. In some embodiments, the structure is then flipped over, and the supporting substrate on which the stacked field effect transistors were formed is then removed. The backside gate cut is then formed to land over frontside gate cut, and then backside interconnects can be formed. This is just one example of a process flow that employs a hybrid gate cut. Additional process steps may be employed. The methods and structures of the present disclosure are now described with reference to FIGS. 1-12.

Figure 3:
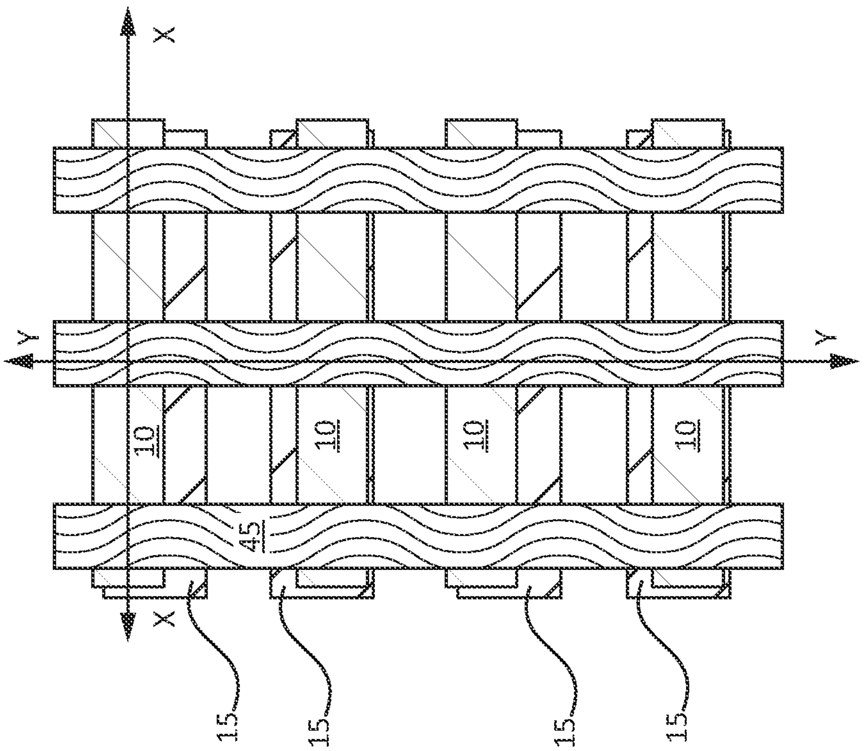
FIG. 3 is a top down view illustrating the side cross-section cut directions for the gate length direction illustrated in FIG. 1, and the gate width direction depicted in FIG. 2.
Figure 2:
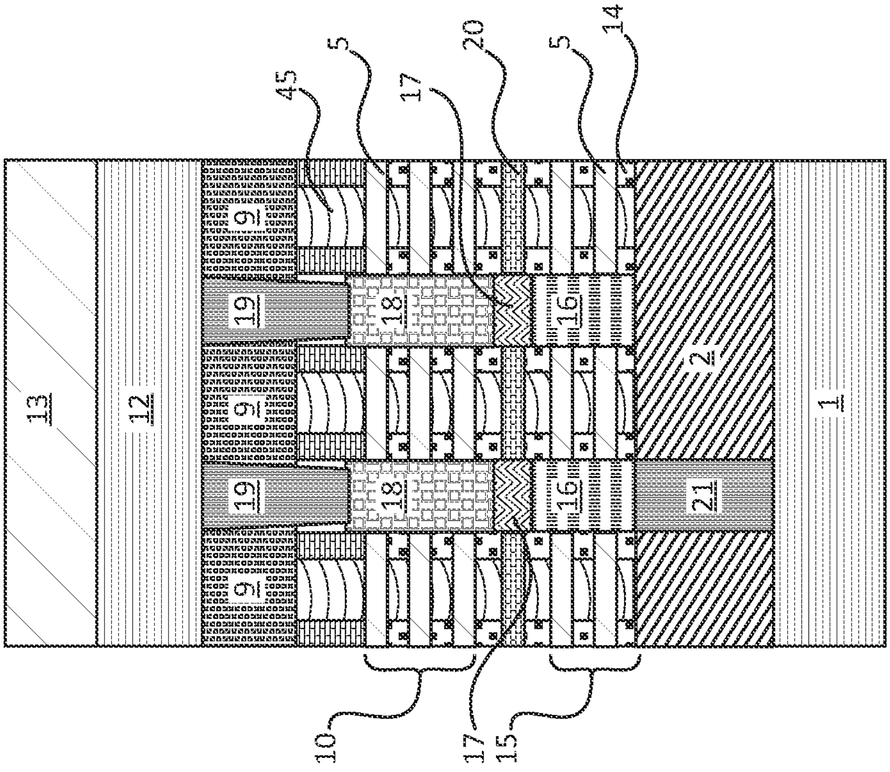
FIG. 2 is a side cross-sectional view of a semiconductor device along a gate width direction for the structure depicted in FIG. 1

FIG. 1 illustrates one embodiment of a semiconductor device 100 that includes a first transistor device 10 stacked over a second transistor device 15, wherein a mid dielectric layer 20 is positioned between the first and second transistor devices 10, 15 and a hybrid gate cut structure 25, 30, 35, 40 is employed to section the gate structure 45 of the device. FIG. 1 is a side cross-sectional view of a semiconductor device along a gate length direction Y-Y of the device. FIG. 2 is a side cross-sectional view of a semiconductor device along a gate width direction X-X for the structure depicted in FIG. 1 FIG. 3 is a top down view illustrating the side cross-section cut directions for the gate length Y-Y direction illustrated in FIG. 1, and the gate width direction X-X depicted in FIG. 2.

The first transistor device 10 may be a stacked structure include first vertically stacked channel regions composed of a semiconductor material. In some examples, the vertically stacked channel regions may be provided by a stack of nanosheets 5. A "nanosheet" is a two-dimensional nanostructure with thickness in a scale ranging from 1 nm to 100 nm. A "nanowire" is similar to a nanosheet, yet has a substantially circular or oblong cross-section. In one example, the nanosheets and/or nanowires may be composed of a type IV semiconductor, such as silicon (Si), germanium (Ge) and/or silicon germanium (SiGe). The nanosheets 5 and/or nanowires may also be provided by a type III-V semiconductor material, such as gallium arsenide (GaAs). It is noted that any semiconductor material that may serve as the channel region of a field effect transistor may be employed for the nanosheets 5 and/or nanowires that provide the vertically stacked channel region of the first transistor device 10.

As noted above, the first transistor device 10 is stacked over a second transistor device 15 in a stacked column arrangement. In some examples, the vertically stacked channel regions of the second transistor device 15 may also be provided by a stack of nanosheets 5. Alternatively, nanowires may also be employed. In one example, the nanosheets and/or nanowires may be composed of a type IV semiconductor, such as silicon (Si), germanium (Ge) and/or silicon germanium (SiGe). The nanosheets may also be provided by a type III-V semiconductor material, such as gallium arsenide (GaAs). It is noted that any semiconductor material that may serve as the channel region of a field effect transistor may be employed for the nanosheets and/or nanowires that provide the vertically stacked channel region of the first transistor device 10.

In some embodiments, to reduce parasitic capacitance the nanosheets 5 for channel regions of the first transistor device 10 have a width W1 that is less than a width W2 for the nanosheets 5 for the channel regions of the second field effect transistor 15.

Still referring to FIG. 1, the nanosheets 5 of the first transistor device 10 are separated from the nanosheets 5 of the second transistor device 15 by a mid dielectric layer 20. While the channel regions of nanosheets 5 for the first and second transistor devices 10 are composed of a semiconductor material, the mid dielectric layer 20 is composed of an insulating material. For example, the mid dielectric layer 20 may be composed of an oxide (e.g., silicon oxide ($SiO_2$)), nitride (e.g., silicon nitride ($Si_3N4$) or oxynitride material (e.g., silicon oxynitride ($SiO_xN_y$). The mid dielectric layer 20 may have a width that is equal to the width W2 of the nanosheets 5 for the second transistor device 15. The mid dielectric layer 20 separates the channel regions of the first transistor 10 from the channel regions of the second transistor 15.

In some embodiments, the first and second transistors 10, 15 are each field effect transistors (FETs). A field effect transistor (FET) is a semiconductor device in which output current, i.e., source-drain current, is controlled by the voltage applied to a gate structure to the semiconductor device. A field effect transistor (FET) has three terminals, i.e., gate structure, source region and drain region. The source and drain regions are identified by reference numbers 16 and 18 in FIG. 2. The source and drain regions are composed of a semiconductor material, such as silicon, and may be doped to a p-type or n-type conductivity. For example, the source/drain regions identified by reference number 16 may be doped to a first conductivity type, such as n-type, while the source and drain/regions identified by reference number 18 may be doped to a second conductivity type, such as p-type, or vice versa. As illustrated in FIG. 2, the source and drain regions 16, 18 may be composed of insitu doped epitaxial semiconductor material, such as a type IV semiconductor, e.g., silicon. An intrinsic semiconductor material, which is not doped to a p-type or n-type conductivity, may be present separating the two differently doped semiconductor materials, as identified by reference number 17.

Referring to FIG. 1., the gate structure 45 of the present devices identified by reference number 45 may be a gate all around (GAA) structure. Gate all around (GAA) denotes that the gate structure encloses the channel region from both a frontside and backside of the channel. In some embodiments, a conformal dielectric layer is formed on suspended channels of a multiple channel region device, such as a vertically stacked nanosheet or nanowire structure. Thereafter, a gate conductive is formed, in which a single gate structure may enclose a plurality of channel regions having the conformal gate dielectric present thereon. In some instances, the gate all around (GAA) structure may include a conformal gate dielectric layer composed of a high-k gate dielectric material, and a gate conductor of an elemental metal (which may be referred to as a metal gate). A high-k gate dielectric may have a dielectric constant greater than silicon, and in some embodiments may be hafnium based, e.g., be composed of hafnium oxide.

FIG. 1 illustrates a stacked structure including a first vertically stacked channel region, e.g., provided by the nanosheets 5 of the first transistor device 10, positioned over a second vertically stacked channel regions, e.g., provided by the nanosheets 5 of the second transistor device 15. The first and second vertically stacked channel regions have the mid dielectric layer 20 positioned therebetween. In some embodiments, the gate all around (GAA) structure, e.g., gate structure 45, has a first portion in electrical communication with the first vertically stacked channel regions and a second portion in electrical communication with the second vertically stacked channel regions.

FIG. 1 illustrates three different geometry hybrid gate cut structures 25, 30, 35, 40. The term "hybrid" means that the gate cut structure is composed of two different portions, which may be referred to as components of the gate cut structure. Each hybrid gate cut structure 25, 30, 35, 40 includes a first transistor gate cut structure (also referred to as first component) 26, 31, 36, 41 that is present on the side of the mid dielectric layer 20 that includes the first transistor device 10. Each hybrid gate cut structure 25, 30, 35, 40 includes a second transistor gate cut structure (also referred to as second component) 24, 29, 34, 39 that is present on the side of the mid dielectric layer 20 that includes the second transistor device 15.

For example, referring to FIG. 1, in one embodiment, at least one two-component gate cut structure (also referred to as hybrid gate structure 25, 30, 35, 40) is present adjacent to the gate all around structure (also referred to as gate structure 45). A first component of the two-component gate cut structure in positioned on one side of the mid dielectric layer 20 adjacent to the first portion of the GAA structure 45, and a second component of the two component gate cut structure is positioned on a second side of the mid dielectric layer adjacent to the second portion of the GAA structure.

FIG. 1 further illustrates a first transistor side gate cut structure 26, 31, 36, 41 that extends through an entirety of a gate structure 45 for the first transistor device 10 to the mid dielectric layer 20; and a second transistor gate cut structure 24, 29, 34, 39 that that extends through an entirety of a gate structure 40 for the second transistor device 15 to the mid dielectric layer 20.

In some instances, the hybrid gate cut structures 25, 30, 35, 40 functions in combination with the mid dielectric layer 20 to provide separate gate structures from the gate all around (GAA) for the first and second transistors 10, 15. For example, the mid dielectric layer 20 intersects with the gate cut structures identified by reference numbers 35 and 40. As illustrated in FIG. 1, the portion of the gate structure 45 that is in direct contact with the nanosheets 5 (also referred to as channel regions) for the first transistor device 10 is isolated by the mid dielectric layer 20 and the intersecting gate cut structures identified by reference numbers 35 and 40 from the portion of the gate structure 45 that is in direct contact with the nanosheets 5 (also referred to as channel regions) for the second transistor device 15. This provides for independent gate control to the channel regions of the first and second transistors devices 10, 15.

Still referring to FIG. 1, in some embodiments a portion of the first component 26, 31, 36, 41 (also referred to as first transistor side gate cut structure) of the hybrid gate cut structures 25, 30, 35, 40 is in direct contact with a second component 24, 29, 34, 39 (also referred to as second transistor side gate cut structure) of the two component gate cut structure (also referred to as hybrid gate cut structures 25, 30, 35, 40) at a level of the stack structure including the mid dielectric layer 20. This embodiment can provide for independent gate control to the channel regions of the first and second transistors devices 10, 15.

In some instances, the mid dielectric layer 20 does not intersect with the hybrid gate cut structures 25, 30, 35, 40. For example, the mid dielectric layer 20 intersects with the gate cut structures identified by reference numbers 30 and 35. As illustrated in FIG. 1, a single portion of the gate structure 45 that is in direct contact with the nanosheets 5 (also referred to as channel regions) for the first transistor device 10 and the second transistor device 15 between the intersecting gate cut structures identified by reference numbers 30 and 35. This provides for gate control to the channel regions of both the first and second transistors devices 10, 15 using a single gate structure 45.

In some embodiments, the first component 26, 31, 36, 41 (also referred to as first transistor side gate cut structure) of the hybrid gate cut structures 25, 30, 35, 40 is in direct contact with a second component 24, 29, 34, 39 (also referred to as second transistor side gate cut structure) of the two component gate cut structure (also referred to as hybrid gate cut structures 25, 30, 35, 40) without contacting the mid dielectric layer 20. This embodiment can provide for gate control to the channel regions of both the first and second transistors devices 10, 15 using a single gate structure 45.

Referring to FIG. 1, the hybrid gate cut structures 25, 30, 35, 40 are formed using two separate process sequences of etching and deposition. An etch process is performed from a front side of the structure including the first transistor device 10, which extends down to a level within the structure at which the mid dielectric layer 20 is present. The trench formed by this etch process through the gate structure 45 is then filled with a dielectric material to provide the first component 26, 31, 36, 41 (also referred to as first transistor side gate cut structure) of the hybrid gate cut structures 25, 30, 35, 40. The backside of the structure including the second transistor device 15 is then processed in a process sequence that follows forming the first component 26, 31, 36, 41 (also referred to as first transistor side gate cut structure) of the hybrid gate cut structures 25, 30, 35, 40. An etch process is performed from the back side of the structure including the second transistor device 15, which extends to a level within the structure at which the mid dielectric layer 20 is present. The trench formed by this etch process through the gate structure 45 is then filled with a dielectric material to provide the second component 24, 29, 34, 39 (also referred to as second transistor side gate cut structure) of the hybrid gate cut structures 25, 30, 35, 40. The method is further described with reference to FIGS. 4-12.

However, by splitting the method for producing a gate cut structure into two separate process sequences, the hybrid gate cut structure structures 25, 30, 35, 40 may have characteristics distinguishable from prior designs. For example, in some embodiments, the taper of the trench formed by the etch for the frontside of the device that is ultimately filled with dielectric material to provide the first component 26, 31, 36, 41 (also referred to as first transistor side gate cut structure) of the hybrid gate cut structures 25, 30, 35, 40 is different from the taper of the trench formed by the etch from the backside of the structure that is ultimately filled with dielectric material to provide the second component 24, 29, 34, 39 (also referred to as second transistor side gate cut structure) of the hybrid gate cut structures 25, 30, 35, 40. For example, the first transistor side gate cut structure 26, 31, 36, 41 has a first taper, and the second transistor side gate cut structure 24, 29, 34, 39 has a second taper, wherein the angle of the first taper is opposite the angle of the second taper, as depicted in FIG. 1. Further, because the deposition step that forms the first transistor side gate cut structure 26, 31, 36, 41 is separate from the deposition step that forms the second transistor side gate cut structure 24, 29, 34, 39, the dielectric compositions of these separate structures of the hybrid gate cut structure structures 25, 30, 35, 40 may be different. For example, the first transistor side gate cut structure 26, 31, 36, 41 is composed of a first dielectric material, and the second transistor side gate cut structure 24, 29, 34, 39 is composed of a second dielectric material, wherein the first dielectric material is a different composition than the second dielectric material.

Further, because the etch processes used to form the trench that is ultimately filled with dielectric material to provide the first transistor side gate cut structure 26, 31, 36, 41 is separate from the etch process that forms the trench for the second transistor side gate cut structure 24, 29, 34, 39, the width of these separate structures of the hybrid gate cut structure structures 25, 30, 35, 40 may be different. For example, the width of the second transistor side gate cut structure 24, 29, 34, 39 may be greater than the width of the first transistor side gate cut structure 26, 31, 36, 41.

It is noted that the structures depicted in FIGS. 1-3 are only one embodiment of the present disclosure, and it is not intended that the present disclosure be limited to only these examples. For example, a design may be employed in which none of the gate cut structures directly contact the mid dielectric layer 20. Further, although the embodiment depicted in FIGS. 1-3 illustrates one example, in which the nanosheets 5 for the first transistor device 10 have a lesser width than the nanosheets 5 for the underlying second transistor device 15, this is also not necessary. For example, other embodiments have been contemplated, in which the width for the nanosheets 5 of the first transistor device 10 are the same as the width for the nanosheets for the second transistor device. 15.

Some embodiments of a method for forming the structure depicted in FIGS. 1-3, are now described with greater detail with reference to FIGS. 4-12. Broadly, the method may for forming a semiconductor device includes forming a vertical stack of two field effect transistors, e.g., first transistor device 10 stacked over second transistor device 15, having a gate all around (GAA) structure, e.g., gate structure 45, to channel regions of the two field effect transistors, wherein a mid dielectric layer 20 is positioned separating channel structures of a first field effect transistor for the two field effect transistor from channel structures of a second field effect transistor for the two field effect transistor. The channel regions may be provided by nanosheets 5 and/or nanowires. The method may further include forming a first field effect transistor gate cut 26, 31, 36, 41 from a first side of the vertical stack that extends to a depth in the vertical stack that is level with the mid dielectric layer 20; and forming a second field effect transistor gate cut 24, 29, 34, 39 from a second side of the vertical stack that extends to the depth in the vertical stack that is level with the mid dielectric layer 20, wherein the first and second sides of the vertical stack are opposite one another. It is noted that this is only one example of the present disclosure. It is not necessary that the separate components of the gate cut structures 25, 30, 35, 40 each extend to a same depth into the vertical stack. For example, embodiments have been contemplated, in which the first and second components 24, 26, 29, 31, 34, 36, 39, 41 for each of the separate gate cut structures 25, 30, 35, 40 have different depths.

Figure 4:
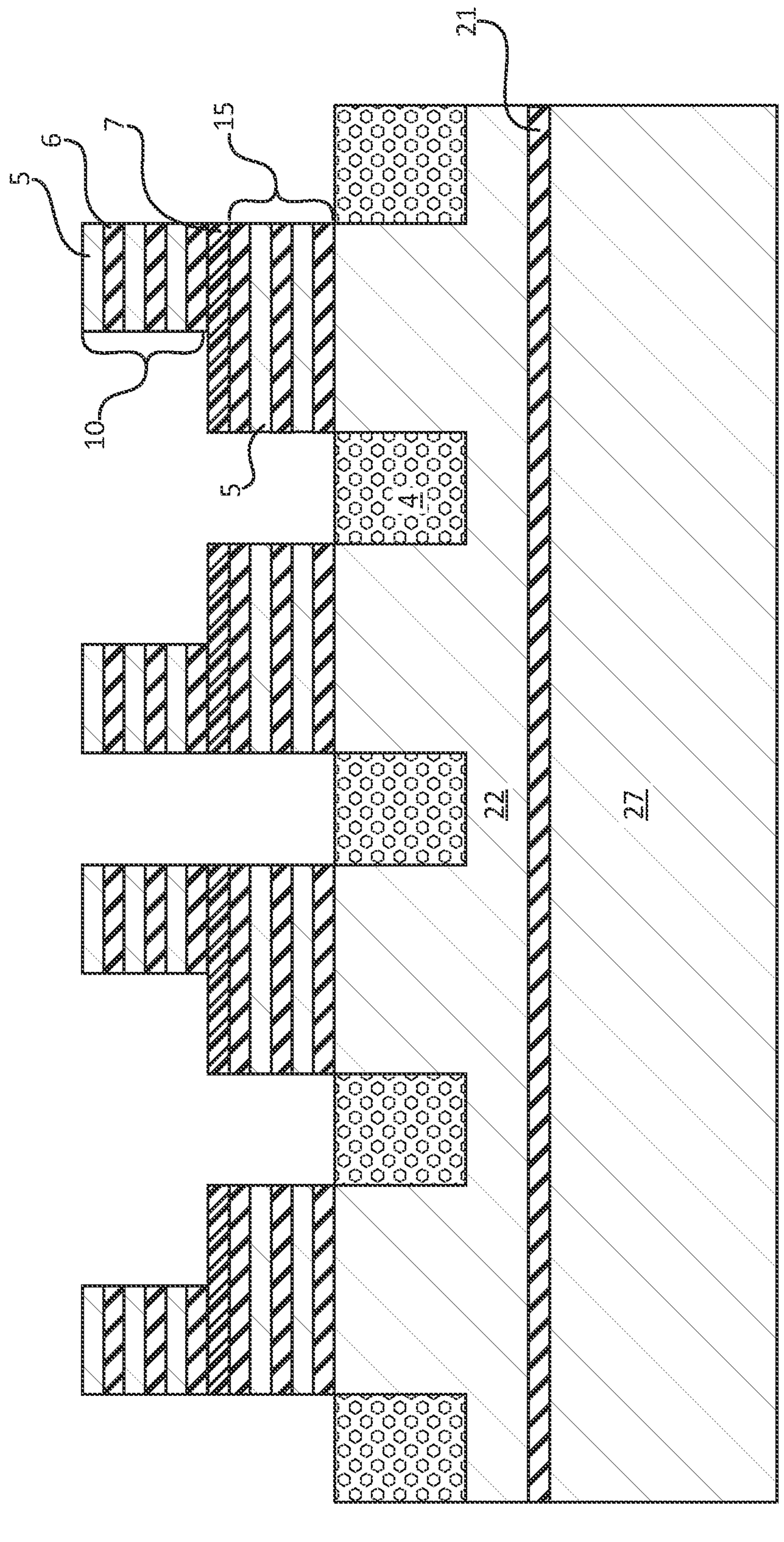
FIG. 4 is a side cross-sectional view of an initial structure that may be employed in method that provides employs a hybrid gate cut process for forming stacked field effect transistors, in accordance with one embodiment of the present disclosure.

FIG. 4 depicts initial structure that may be employed in method that provides employs a hybrid gate cut process for forming stacked field effect transistors 10, 15. The initial structure is formed from a nanosheet stack that is present atop an epitaxial semiconductor layer 22, in which the epitaxial semiconductor layer 22 is separated from a supporting substrate 27 by an etch stop layer 21. Each of the epitaxial semiconductor layer 22, the etch stop layer 21 and the supporting substrate 27 may be composed of a type IV semiconductor. For example, the epitaxial semiconductor layer 22 and the supporting substrate 27 may be composed of silicon (Si). To provide for etch selectivity relative to the epitaxial semiconductor layer and the supporting substrate 27 composed of silicon, the etch stop layer 21 may be composed of silicon germanium (SiGe).

The nanosheet stack that is present atop the epitaxial semiconductor layer 22 may be a multilayered structure composed of silicon nanosheets 5 which are ultimately processed to provide channel regions for the first and second transistor devices 10, 15. In the embodiment depicted in FIG. 4, the stack of nanosheets includes a repeating sequence of two nanosheets 5, 6 having different compositions for providing the suspended nanosheets 5 for the channel regions of the first and second transistor devices 10, 15. For example the layered semiconductor materials that provide the nanosheet stack of layers having reference numbers 5 and 6 can include alternating semiconductor layers of a silicon (Si) layer for the nanosheets 5, and silicon germanium (SiGe30) layer having 30% germanium (Ge) content for the sacrificial nanosheet that is ultimately removed to produce the suspension of nanosheets 5.

In one example, the nanosheet stack also includes a replacement mid dielectric layer 7 (which may also be referred to as a sacrificial mid dielectric layer 7). The replacement mid dielectric layer 7 is composed of an epitaxial semiconductor material for positioning amongst the other epitaxial semiconductor material layer, in which the semiconductor material composition replacement mid dielectric layer 7 is ultimately removed and replaced with a dielectric material to provide the mid dielectric layer 20. The replacement mid dielectric layer 7 is positioned in the stack to separate the portions of the stack for the first transistor device 10 from the second transistor device 15. In one example, the replacement mid dielectric layer 7 is composed of a silicon germanium layer (SiGe55) having 55 wt. % germanium. The composition of the replacement mid dielectric layer 7 is selected so that it can be removed using an etch process that is selective, i.e., does not remove, the other layers, i.e., nanosheet stack of layers having reference numbers 5 and 6, during the etch processes that remove the sacrificial mid dielectric layer 7.

The stack of the layered semiconductor materials for the nanosheets 5, 6, 7 may be formed using a deposition process, such as epitaxial deposition. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. The thickness of each layer within the stack of the layered semiconductor materials for the nanosheets 5, 6, 7 may range from 1 nm to 30 nm. In another embodiment, the thickness of each layer within the stack of the layered semiconductor materials 5, 6, 7 may range from 5 nm to 20 nm.

In some embodiments, the stack of the layered semiconductor materials for the nanosheets 5, 6, 7 is patterned and etched to provide the active regions for the first and second transistor devices. The bottom active region provides at least the nanosheet channels for the second transistor device 15. The top active region provides at least the nanosheet channels for the first transistor device 10. The replacement mid dielectric layer 7 is present between these two regions. To pattern the structure, a mask layer (not shown) may be formed atop the stack of nanosheets. The pattern process sequence may be used in combination with process steps for forming isolation regions 4 between adjacent vertical stacks of semiconductor layers for the active regions of the first and second transistor devices 10, 15. In some examples, a hardmask may be used for patterning the stack of nanosheets. In some embodiments, the hardmask may be composed of a nitride, such as silicon nitride.

For example, a pattern (not shown) is produced by applying a photoresist to the surface to be etched; exposing the photoresist to a pattern of radiation; and then developing the pattern into the photoresist utilizing conventional resist developer. Once the patterning of the photoresist is completed, the sections of the nanosheet stack covered by the photoresist are protected while the exposed regions are removed using a selective etching process that removes the unprotected regions. The etch process may include a direction etch process, such as reactive ion etching (RIE).

In some embodiments, the etch process may include a process that provides the nanosheet stack that provides the bottom active region (Rx) for the second transistor device 15 have a greater width than the top active region (Ry) for the first transistor device 10. In some embodiment, the sacrificial mid dielectric layer 7 can be employed as an etch stop. For example, in one scenario, the mid dielectric layer 20 can be formed before the nanosheets 5 for the first transistor device 10 are patterned. In this example, the mid dielectric layer 7 can function as an etch stop layer. In some embodiments, the etch process may continue to form trenches in the epitaxial semiconductor layer 22, which are filled with dielectric material to provide isolation regions 4 between adjacent stacks of nanosheets 5.

Figure 5:
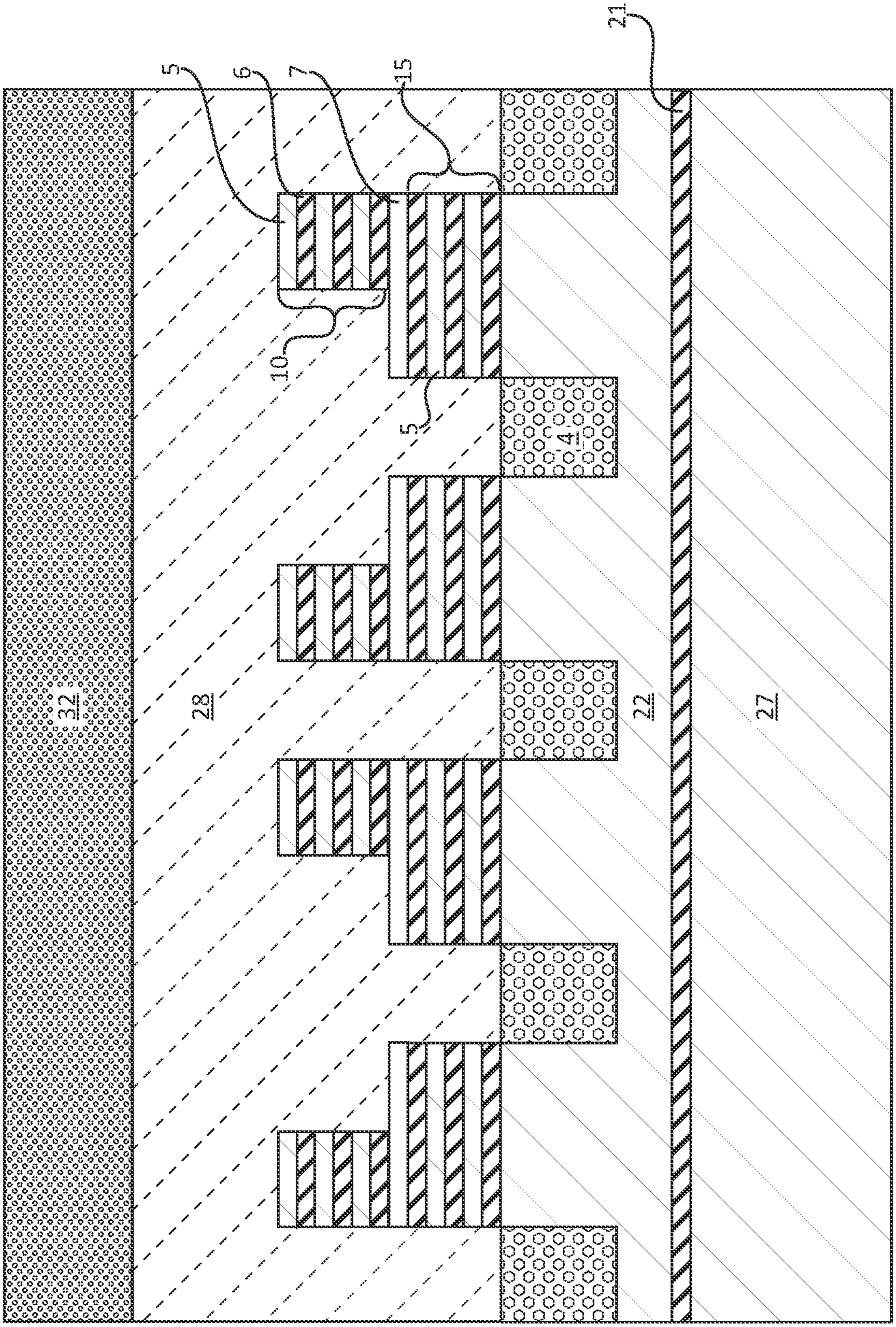
FIG. 5 is a side cross-sectional view illustrating one embodiment of forming a dummy gate structure followed by removing the sacrificial mid dielectric layer.

FIG. 5 is a side cross-sectional view illustrating one embodiment of forming a replacement gate structure 28 followed by removing the sacrificial mid dielectric layer. By "replacement", e.g., as used to describe the replacement gate structure 28, it is meant that the structure is present during processing of the semiconductor device, but is removed from the semiconductor device prior to the device being completed. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the replacement gate structure 28 may be composed of any material that can be etched selectively to the at least one of the material layers of the stacks of the at least two semiconductor materials 5, 6, 7 of the nanosheet stacks, as well as the gate spacers. In one embodiment, the sacrificial material of the replacement gate structure 28 may be composed of a silicon-including material, such as polysilicon. In another embodiment, the sacrificial material 28 replacement gate structure may be composed of a dielectric material, such as an oxide or amorphous carbon. The replacement gate structure 28 may be formed using deposition (e.g., chemical vapor deposition) photolithography and etch processes (e.g., reactive ion etching). In some embodiments, a mask structure may be employed as illustrated by reference number 11. The mask structure 32 may be provided using deposition and photolithography steps, and may be employed in combinations with the directional, i.e., anisotropic, etch processes to shape the geometry of the replacement gate structure 28 that is composed of the sacrificial material. Using the mask structure 32, the sacrificial material that provides the replacement gate structure 28 may be etched to provide the gate geometry in accordance with the mask 32 using a directional etch process, such as reactive ion etching (RIE).

FIG. 5 further depicts removing the high germanium content, e.g. 55%, silicon germanium material of the sacrificial mid dielectric layer 7. The sacrificial mid dielectric layer 7 may be removed by an isotropic etch, e.g., non-directional etch, such as a gas etch or plasma etch. In some embodiments, the etch process for removing the sacrificial mid dielectric layer 7 is selective to the other material layers identified by reference numbers 5 and 6 in the stacks that are processed to provide the nanosheets 5 for the channel regions of the first and second transistor devices 10, 15. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, the etch process may remove the silicon and germanium (SiGe) containing material having a germanium content of 55 wt. % of the replacement mid dielectric layer 7 without removing the semiconductor material of silicon (Si) that provides the nanosheets 5 for the channel region, and/or without removing the layers 6 composed silicon and germanium (SiGe) having a germanium (Ge) content of 30%.

Figure 6:
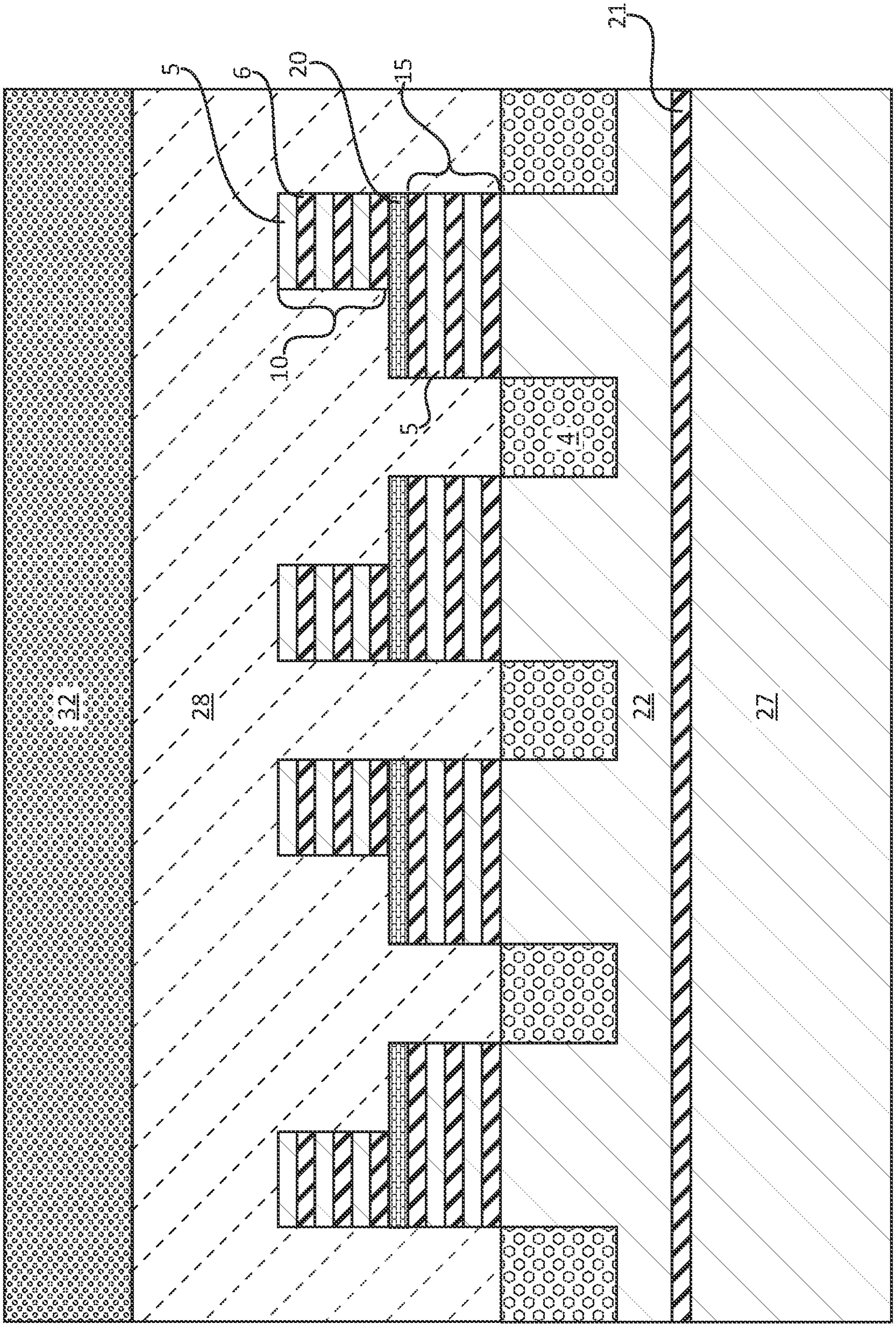
FIG. 6 is a side-cross-sectional view illustrating filling the space that is formed by removing the sacrificial mid dielectric layer with a dielectric material to provide the mid dielectric layer between the nanosheets for the first and second transistor devices, in accordance with one embodiment of the present disclosure.

FIG. 6 illustrates one embodiment of filling the space that is formed by removing the sacrificial mid dielectric layer 7 with a dielectric material to provide the mid dielectric layer 20 between the nanosheets 5 for the first and second transistor devices 10, 15.

Forming the mid dielectric layer 20 may include a process sequence that also forms a gate spacer 44, as depicted in FIG. 2. The process sequence also includes forming an inner spacer 14 that supports the nanosheets 5 during a process sequence that includes substituting the replacement gate structure 28 with a functional gate structure 45.

The space provided by removing the replacement mid dielectric layer 7 is filled with a dielectric material using deposition and etch back processes to provide the mid dielectric layer identified by reference number 20 in FIG. 6. For example, the mid dielectric layer 20 may be composed of a dielectric material, such as silicon nitride or silicon oxide, and may be formed using a deposition process, such as chemical vapor deposition (CVD) or atomic layer deposition (ALD). In some embodiments, following deposition of the material for the mid dielectric layer 20, an etch back process, such as reactive ion etching (RIE) may be employed to further tailor the geometry of the layer. The etch back process may include a direction etch, such as reactive ion etching (RIE). The gate spacer 44 that is abutting the replacement gate structure 28 may also be formed using deposition and etch back processes, as described for forming the mid dielectric layer 20. Following the formation of the gate spacer 44, the exposed portions of the stack of nanostructures 5, 6 may be etched. This can provide the space in which the source and drain regions 16, 17, are subsequently formed. The etch process for etching the stack of nanostructures 5, 6 may be an anisotropic etch, such as reactive ion etching (RIE), and may be referred to as a nanostructure etch back.

In a following process sequence, the inner spacer 14 may then be formed, as depicted in FIG. 2. The nanostructure etch back forms trenches in the stack of semiconductor material layer 5, 6, in which the sidewall of the trenches are provided by the alternating compositions of the semiconductor material layers 5, 6 along the height of the trench formed through the stack. Forming the inner spacer 14 can begin with forming a divot in the sidewall of the trenches, e.g., by laterally etching one of the semiconductor material layers 5, 6. For, an isotropic etch, such as a plasma etch or gas phase etch, may laterally etch the semiconductor material layers that provide the nanosheets 5 relative to the semiconductor material layers 6 forming a plurality of recesses or divots on the sidewalls of the trenches etched into the stack. A dielectric material is then formed in the recesses or divots that have been formed on the sidewalls of the trenches. The dielectric material is first deposited filling the recesses or divots, and is then etched to provide that the dielectric material remains within the recesses and divots forming the inner spacers 14, yet is removed from the portions of the structure that are outside the recesses or divots. In one embodiment, a conformal dielectric layer for inner spacer 14 formation is deposited on the sidewalls of the trench that are formed by patterning the stack of nanosheets 5. The conformal dielectric layer may be an oxide, nitride or oxynitride material. In one example, the conformal dielectric layer is composed of silicon nitride, however, silicon oxide may also be used. The conformal dielectric layer may be deposited using a conformal deposition process, such as chemical vapor deposition, such as plasma enhanced chemical vapor deposition or metal organic chemical vapor deposition. The conformal dielectric layer may also be deposited using atomic layer deposition (ALD). Following deposition of the conformal dielectric layer, a directional etch, such as reactive ion etching (RIE), is used to remove the portions of the conformal dielectric layer that are not present in the divots/recessed, which forms the inner spacers 14.

The method may continue with forming the semiconductor material for the source and drain regions 16, 18 depicted in FIG. 2. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The source and drain regions may be composed of epitaxial semiconductor material that is doped to an n-type or p-type dopant. In some embodiments, the epitaxial semiconductor material that provides the source and drain regions 16, 18 may be composed of silicon (Si), germanium (Ge), silicon germanium (SiGe), silicon doped with carbon (Si:C), or the epitaxial semiconductor material that provides the source and drain regions may be composed of a type III-V compound semiconductor, such as gallium arsenide (GaAs).

The epitaxial semiconductor material for the source and drain regions 16, 18 may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous. The source and drain regions identified by 16 provide the source and drain regions for the second transistor device 15, which have an active region provided by the nanosheets 5 having the second width W2. The source and drain regions identified by 18 provide the source and drain regions for the first transistor device 10, which have an active region provided by the nanosheets 5 having the first width W1. The conductivity for the source and drain regions for the first and second transistor devices may be different. For example, the first transistor devices 10 may have source and drain region 18 having a first conductivity type, e.g., n-type, while the second transistor devices 15 have source and drain regions 16 with a second conductivity type, e.g., p-type, and vice versa. To separate the different conductivity source and drain regions 16, 18, an intrinsic epitaxial region identified by 17 may be formed therebetween that is not doped to a first or second conductivity type.

Figure 7:
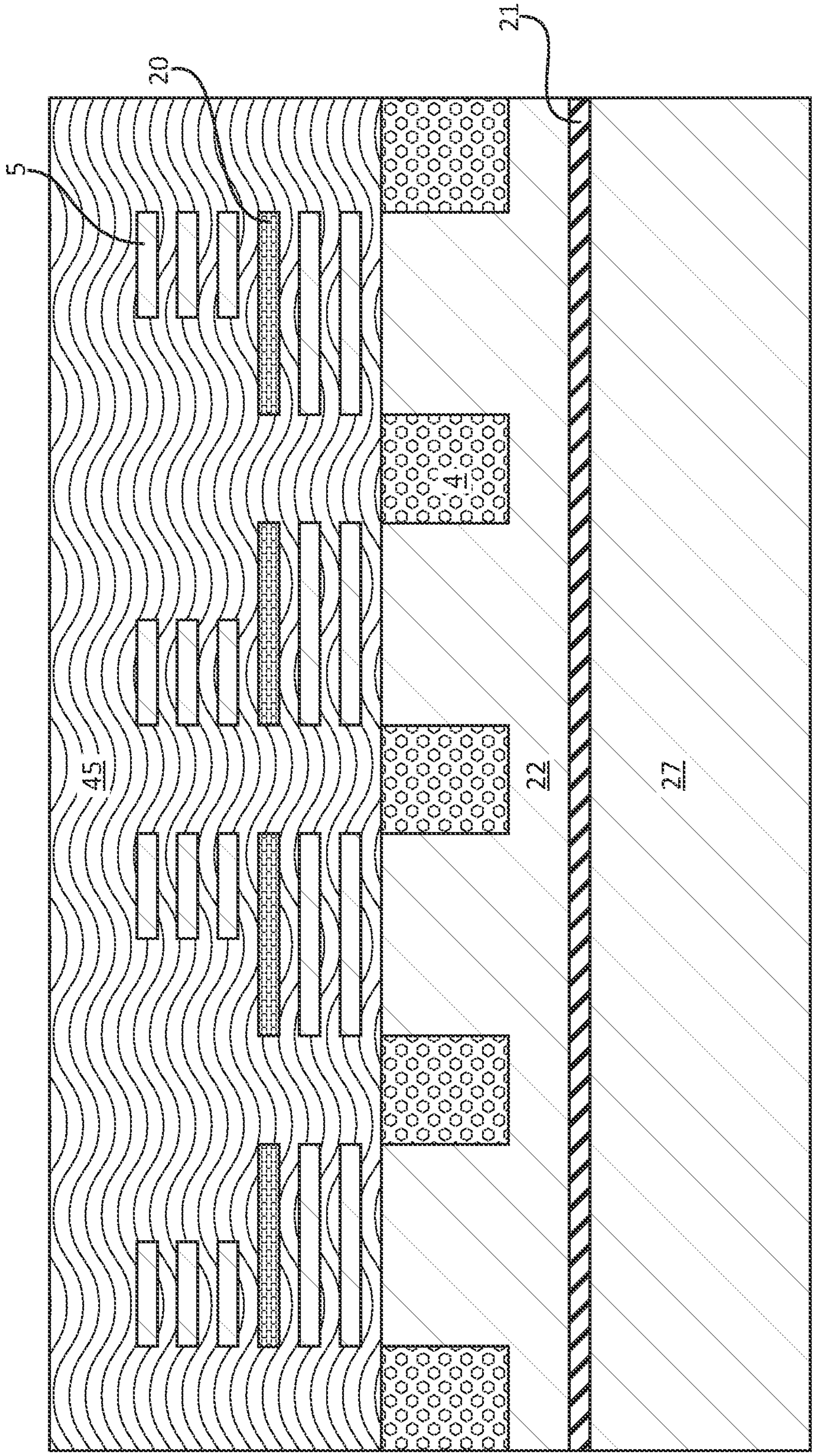
FIG. 7 is a side cross-sectional view illustrating removing the replacement gate structure and forming a functional gate structure 45, in accordance with one embodiment of the present disclosure.

FIG. 7 illustrates removing the replacement gate structure and forming a functional gate structure 45, which may include a high-k gate dielectric and a metal gate conductor. This process sequence may be referred to as substituting a gate structure 45 for the replacement gate structure 28. In some embodiments, the process sequence for removing the replacement gate structure, e.g., including the sacrificial material for the replacement gate structure 28 and the mask structure identified by reference number 32, can begin with depositing an interlevel dielectric layer. The interlevel dielectric layer may have a composition selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). The interlevel dielectric layer may be deposited using a deposition process, such as spin on deposition (SOD) followed by a planarization process, such as chemical mechanical planarization (CMP). The planarization process may be continued until the upper surface of the interlevel dielectric layer is coplanar with the upper surface of the mask structure identified by reference number 32.

The mask structure 32 and replacement gate structure 28 may then be removed using a selective etch process. More particularly, removing the replacement gate structure using a selective etch process may include removing the sacrificial material for the replacement gate structure 28 and the mask structure identified by reference number 32, without removing the semiconductor material layers 5, 6 in the stack for providing the nanosheets, as well as without removing the mid dielectric layer 20.

In some embodiments, once the sacrificial gate structure is removed, the semiconductor material layers 5, 6 of the stack for the first and second transistor device 10, 15 can be further processed to provide nanostructures, e.g., nanowires and/or nanosheets. For example, when the stack of semiconductor material layers 5, 6 are further processed to provide nanowires, the semiconductor material layers identified by reference number 6 may be removed selectively to the semiconductor material layers identified by reference number 5. This provides a plurality of suspended semiconductor material layers, which ultimately provided suspended nanosheet channels 5.

In some embodiments, the suspended structure, e.g., semiconductor material layer 5, may be further processed to a geometry in the nanometer regime. For example, the semiconductor material layers 5 may be thinned by a process that includes controlling thinning of the silicon (Si) containing nanosheets 5, which can include ozone ($O_3$) oxidation, SC1 chemistry oxidation and/or dry oxidation. The geometry may also be modified to provide nanowires.

The method continues with the forming a functional gate structure 45 in the space that was created by removing the replacement gate structure 28. In some embodiments, the functional gate structure 45 is a gate all around (GAA) structure including a high-k gate dielectric and a metal gate conductor. The gate dielectric may be a high-k dielectric material, such as hafnium oxide ($HfO_2$). The gate dielectric for the gate all around structure may be deposited using chemical vapor deposition (CVD) or atomic layer deposition (ALD) and is present on the entirety of the exterior surfaces of the suspended nanosheets 5. The metal gate conductor for the gate structure 45 may encapsulate the suspended nanosheets 5 including the gate dielectric present on the exterior surfaces of the suspended nanosheets 5. The gate conductor may be composed of a metal, such as tungsten (W) or an n-type or p-type work function metal, e.g., titanium nitride. It is noted that the prior examples are provided for illustrative purposes only, and are not intended to limit the teachings of this disclosure solely thereto. For example, the gate conductor for the gate all around structure that provides the functional gate structure 45 may be composed of other conductive materials, such as a doped semiconductor, e.g., n-type doped polysilicon. Each of the aforementioned layers may be formed using a deposition method, such as chemical vapor deposition, atomic layer deposition, plating, physical vapor deposition, etc.

Figure 8:
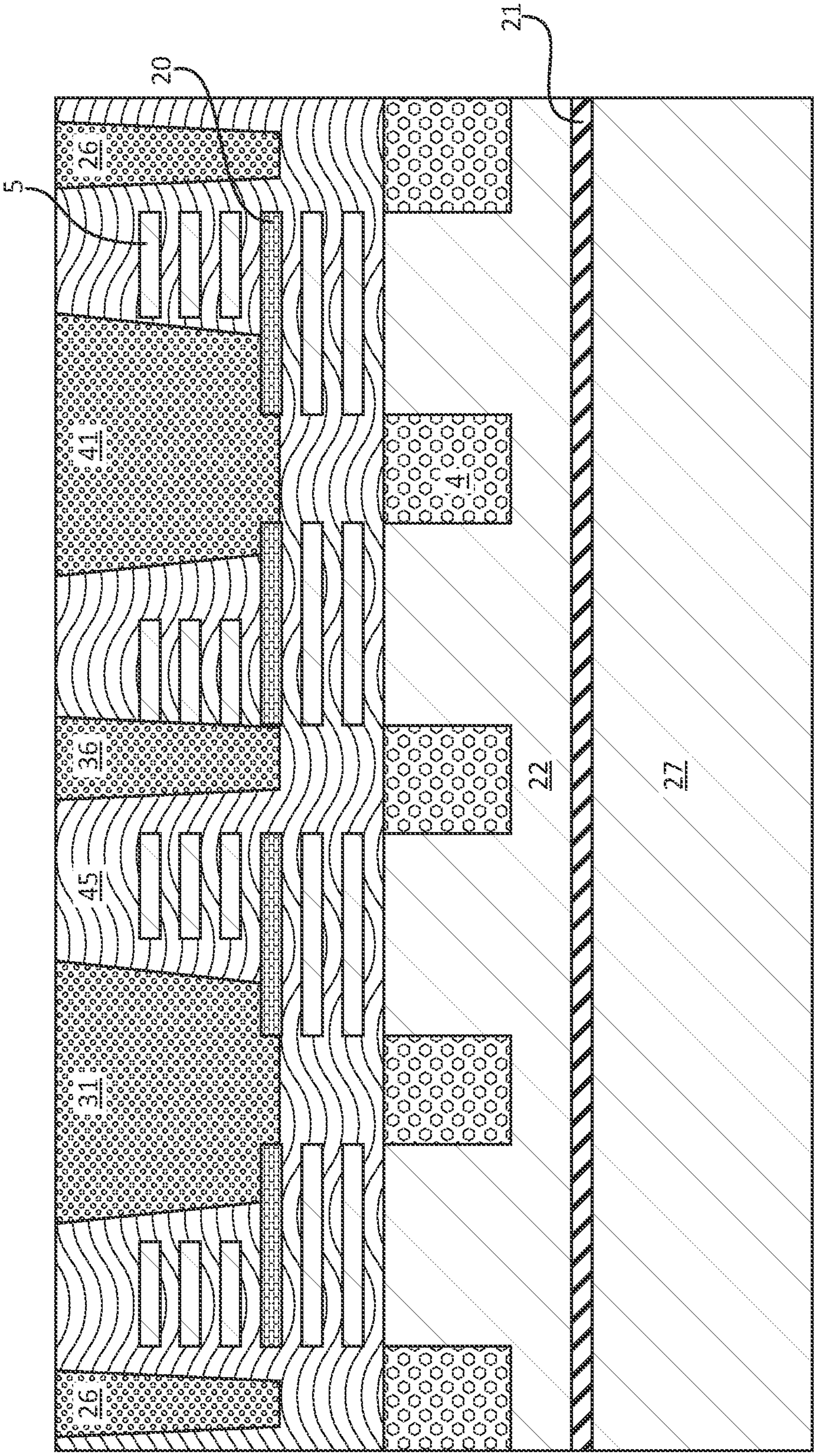
FIG. 8 is a side cross-sectional view illustrating forming a first transistor gate cut structure (also referred to as first component) of the hybrid gate cut structures, in accordance with one embodiment of the present disclosure.

FIG. 8 illustrates forming a first transistor gate cut structure 26, 31, 36, 41 (also referred to as first component) of the hybrid gate cut structures 25, 30, 35, 40.

The first transistor gate cut structure 26, 31, 36, 41 (also referred to as first component) are formed by etching a trench in the gate structure 45 utilizing a dry etching process, such as reactive-ion etching (RIE) or plasma etching. The etch process may be timed to provide that the depth of the trench is approximate to the depth of the mid dielectric layer 20. In some instances, the etch process for forming the trench for the first transistor gate cut structure 26, 31, 36, 41 (also referred to as first component) may be selective to the mid dielectric layer 20. In some instances, end point detection may be employed to determine when the trench reaches the appropriate depth so that the etch process can be terminated.

The depth of the trench for the first transistor gate cut structure 26, 31, 36, 41 (also referred to as first component) is shallow, which allows for easy control of the critical dimension (CD). In some embodiments, the first component of the at least one two-component gate cut structure has a first length (depth), and the second component of the at least one two-component gate cut structure has a second length (depth), wherein the first length is different from the second length. Further, the shallow depth of the etch process for forming the trench for the forming a first transistor gate cut structure 26, 31, 36, 41 (also referred to as first component)

also provides for easy control of the gate extension dimension. The gate extension dimension is the dimension separating the outermost edge of the nanosheet 5 from the closest portion of the first transistor gate cut structure 26, 31, 36, 41. The trenches for the first transistor gate cut structures may optionally be lined with a conventional liner material, e.g., a nitride, and then CVD or another like deposition process is used to fill the trench with another like dielectric material, e.g., an oxide, such as silicon oxide ($SiO_2$). A planarization process such as chemical-mechanical polishing (CMP) may optionally be used to provide a planar structure.

In some embodiments, the positioning of the first transistor gate cut structure 31 is selected to provide a hybrid gate cut structure 30 that enables minimized parasitic capacitance. In this example, the first transistor gate cut structure 31 has a width that is greater than the width of the opposing second gate cut structure 29 that is formed from the opposing side of the structure in a later process step. This provides that the amount of material, e.g., width, for the gate conductor of the gate structure to the ultimately formed first transistor device 10 is less than the amount of material, e.g., width, for the gate conductor of the ultimately formed second transistor device 15, as illustrated in FIGS. 1 and 8. As noted above, the width of the nanosheets 5 for the first transistor device 10 is less than the width of the nanosheets 5 for the second transistor device, as illustrated in FIGS. 1 and 8. This characteristics facilitate minimized parasitic capacitance. Further, for the hybrid gate cut structures identified by reference number 30, the first transistor gate cut structure 31 is formed into direct contact with a portion of the mid dielectric layer 20.

In some embodiments, the positioning of the first transistor gate cut structures 36, 41 are selected to provide a hybrid gate cut structures 35, 49 that enable independent devices. As illustrated in FIGS. 1 and 8, the first transistor gate cut structures identified by reference numbers 36 and 41 are in direct contact with the mid dielectric layer 20, and position a stack of nanosheets 5 for the first transistor device 10 between the first transistor gate cut structures identified by reference numbers 36 and 41. This isolates the portion of the gate structure 45 to the nanosheets 5 of the first transistor device 10, from the portion of the gate structure 45 that contacts the nanosheets 5 of the second transistor device that are positioned on the opposing side of the mid dielectric layer 30, as depicted in FIGS. 1 and 8. In some embodiments, the first transistor side gate cut region 36 removes a gate extension from one side of nanosheets 5 that provides the first transistor device 10 to enable independent gate devices for the first and second transistor devices 10, 15.

In some embodiments, the positioning of the first transistor gate cut structures 26 is positioned to be in direct contact with the later formed second gate cut structure 45 without contacting the mid dielectric layer 20.

Figure 9:
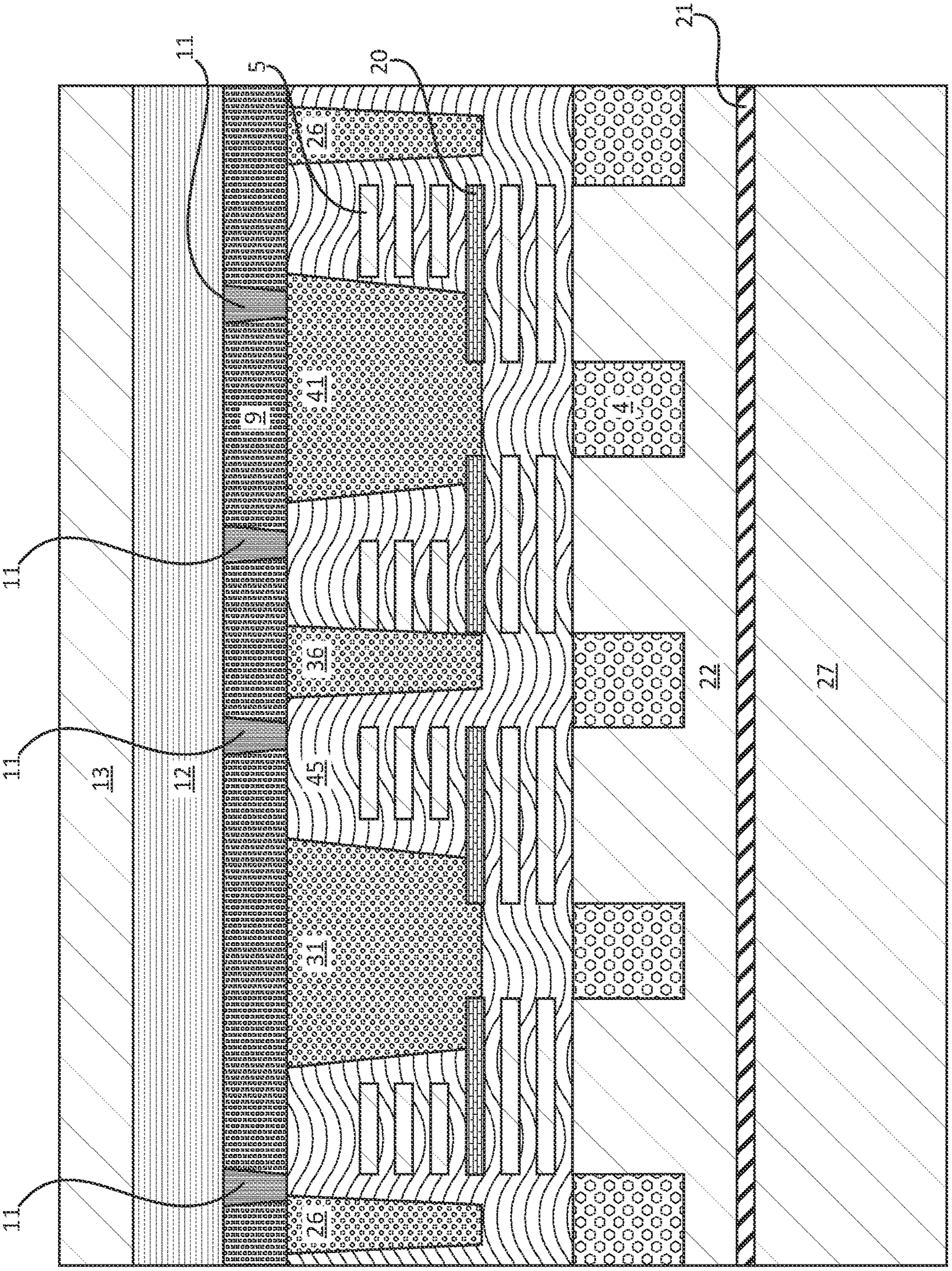
FIG. 9 is a side cross-sectional view illustrating forming middle of the line (MOL) contacts, back end of the line (BEOL) processing, and bonding a carrier wafer, in accordance with one embodiment of the present disclosure.

FIG. 9 is a side cross-sectional view illustrating forming middle of the line (MOL) contacts, back end of the line (BEOL) processing, and bonding a carrier wafer. The middle of the line contacts may include contacts 11 to the gate structure 45, and contacts 19, 21 to the source and drain regions 16, 18, as depicted in FIGS. 1, 2 and 9. These contacts may be formed in via openings that are formed into dielectric layers 9. The back end of the line (BEOL) processing level 12 includes metal lines and vias that may be in electrical communication with the contacts produced in the middle of the line (MOL). The process sequence that is used for forming the metal lines and vias is a back end of the line (BEOL) process. In some embodiments, an interlevel dielectric layer is first deposited and then etched to form via openings to the underlying contacts. Thereafter, the via openings are then filled with an electrically conductive material, such as a metal, e.g., copper, to provide a via. Thereafter, a deposition, pattern and fill sequence is repeated to forms lines. This may be referred to a single damascene method for forming lines and vias. However, dual damascene sequences are also applicable. The sequence of deposition, pattern and etch are repeated as many times as needed to form each level of metal lines and vias. The carrier wafer 13 provides support to the structure, as the backside of the device is processed.

Figure 10:
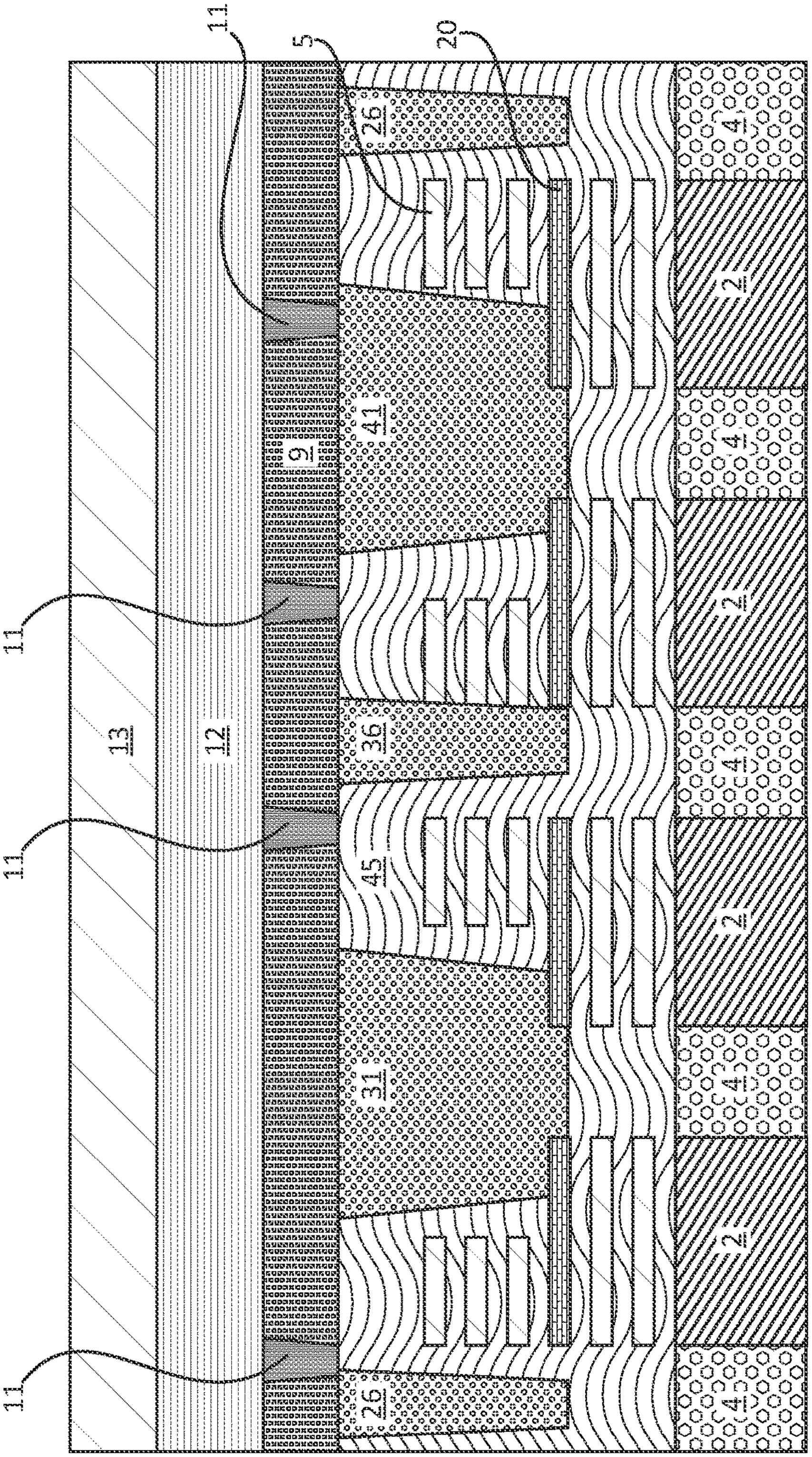
FIG. 10 is a side cross-sectional view illustrating removing the supporting substrate, etch stop layer and remaining portions of the epitaxial semiconductor layer that is present atop the etch stop layer, and forming a dielectric material in the space formed by removing the epitaxial semiconductor layer, in accordance with one embodiment of the present disclosure.

FIG. 10 illustrates one embodiment of removing the supporting substrate 27, etch stop layer 21 and remaining portions of the epitaxial semiconductor layer 22 that is present atop the etch stop layer 21. The supporting substrate 27 may be removed by an etch process that is selective to the etch stop layer 21. Thereafter, the etch stop layer 21 may be removed by an etch process that is selective to the epitaxial semiconductor layer 22. The epitaxial semiconductor layer 22 may then be removed by an etch process that is selective to the isolation regions 4 and the gate structure 4. It is noted, that planarization processes may be substituted for or used in combination with the aforementioned etch processes described with reference to FIG. 10.

FIG. 10 further depicts forming a dielectric material 2 in the space between the isolation regions 4 that is formed by removing the epitaxial semiconductor layer 22. The composition of the dielectric material 2 is selected to provide the isolation regions 4 may be selectively etched without substantially removing the dielectric material identified by reference number 2. For example, the dielectric material 2 may be a dielectric including elements of silicon, oxygen, nitrogen and carbon. Flowable dielectric and spin on glass compositions may also be employed. The deposition process for form the dielectric material may also include chemical vapor deposition. Following deposition, a planarization process may be optionally employed.

Figure 11:
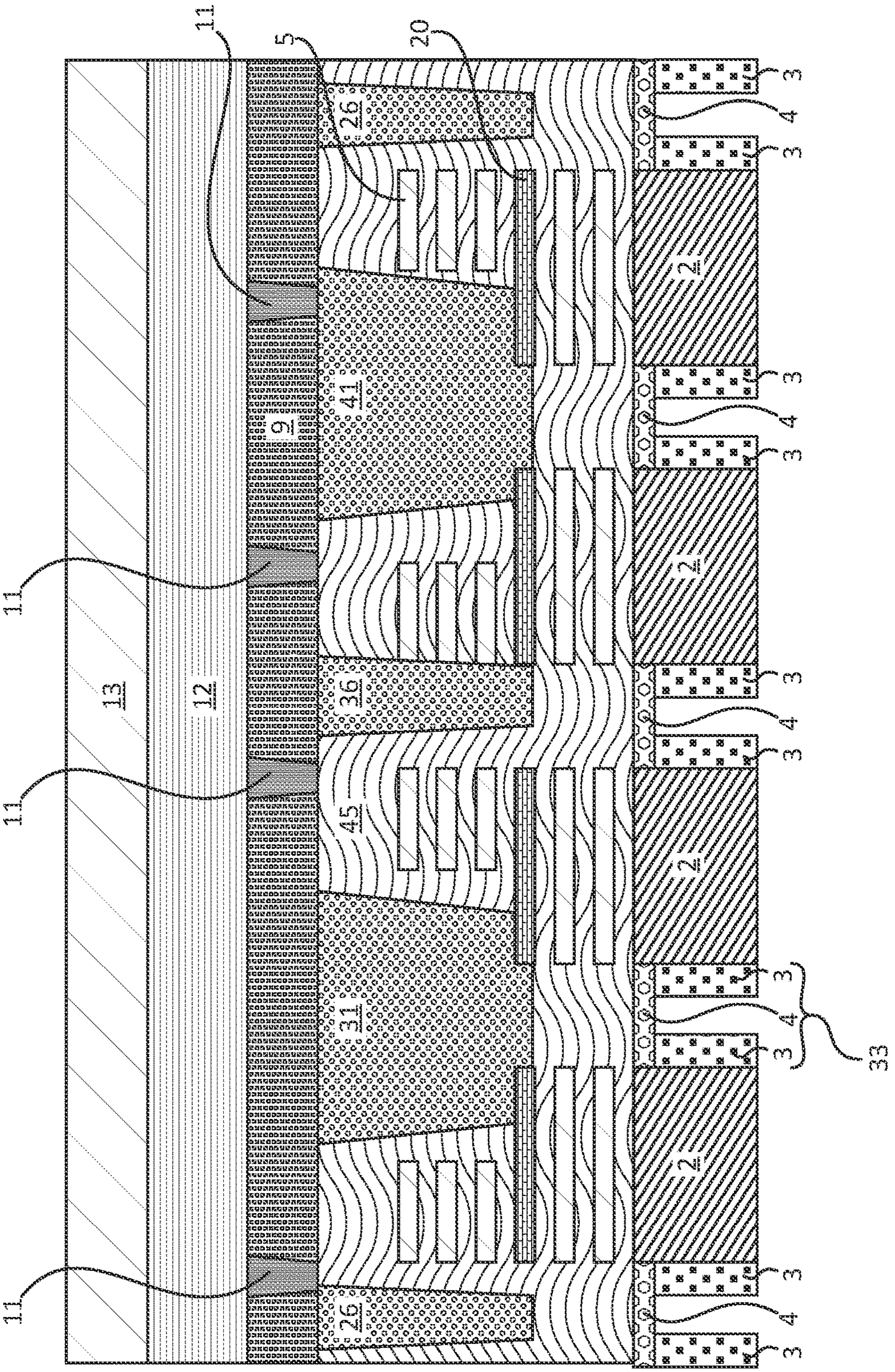
FIG. 11 is a side cross-sectional view illustrating recessing isolation regions, and forming alignment spacers that are used to etch trenches for forming the second transistor gate cut structure (also referred to as second component) of the hybrid gate cut structures, in accordance with one embodiment of the present disclosure.

FIG. 11 illustrates recessing the isolation regions 4 to expose sidewalls of the dielectric material identified by reference number 2, and forming alignment spacers 3 on the exposed sidewalls. The isolation regions 4 are formed in trenches that were etched using the same pattern that was used to pattern the nanosheets 5 that are vertically stacked for the channel regions of the first and second transistor devices 10, 15. For this reason, the isolation regions 4 are aligned with at least one edge of the active regions of the first and second transistor devices 10, 15. The upper active region is provided by the nanosheets 5 that provide the channel regions of the first transistor device 10. The lower active region is provided by the nanosheets 5 that provide the channel region to the second transistor device 15.

The isolation regions 4 are recessed by a directional etch, such as reactive ion etch (RIE). The etch process for recessing the isolation regions 4 may be selective to the dielectric material identified by reference number 2.

The alignment spacers 3 are formed on the sidewalls of the dielectric material identified by reference number 2, which is exposed by recessing the isolation regions 4. Because the isolation regions 4 are aligned to the active regions, when the alignment spacers 3 are formed on the sidewall structures of the dielectric exposed by recessing the abutting isolation regions 4, the alignment spacers 3 are self-aligned to the active regions. Because the edges of the active regions can be provided by the outermost edges of the nanosheets 5 that provide the channel regions for the first and second transistor devices 10, 15, the width of the alignment spacers 3 can dictate the width of the gate extension. The gate extension dimension is the dimension separating the outermost edge of the nanosheet 5 from the closest portion of the hybrid gate cut structure 25, 30, 35, 40. In one embodiment, the alignment spacers 3 may be formed by a deposition process, such as chemical vapor deposition, and an anisotropic etchback method. The alignment spacers 3 may have a width ranging from 1.0 nm to 10.0 nm, and may be composed of a dielectric, such as a nitride, oxide, oxynitride, or a combination thereof.

Figure 12:
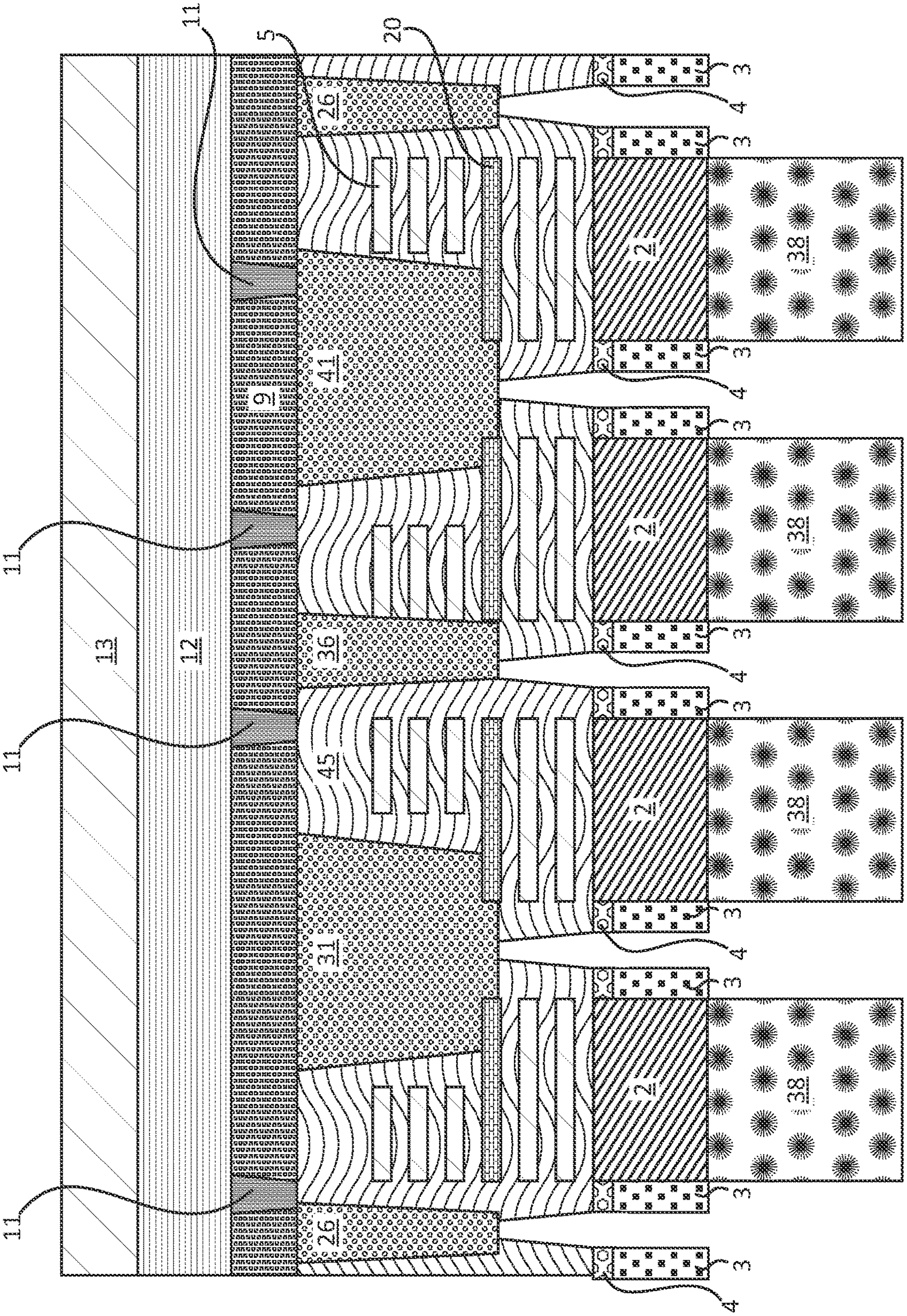
FIG. 12 is a side cross-sectional view illustrating forming trenches for the second transistor gate cut structure (also referred to as second component) of the hybrid gate cut structures using the alignment spacers and an etch process, in accordance with one embodiment of the present disclosure.

FIG. 12 illustrates forming trenches for the second transistor gate cut structure 24, 29, 34, 39 (also referred to as second component) of the hybrid gate cut structures 25, 30, 35, 40 using the alignment spacers 3 and an etch process. The etch process may be referred to backside gate cut patterning. The etch process may be an anisotropic etch, such as reactive ion etching. The depth of the trenches extend into contact with the first transistor gate cut structure 26, 31, 36, 41 (also referred to as first component) of the hybrid gate cut structures 25, 30, 35, 40. Because the etch process for forming the trenches for the first and second transistor gate cut structure 24, 26, 29, 31, 35, 36, 39, 41 of the hybrid gate cut structures 25, 30, 35, 40 are separate they may have a different taper angle.

The depth of the trench for second transistor gate cut structure 24, 29, 34, 39 (also referred to as second component) of the hybrid gate cut structures 25, 30, 35, 40 is shallow, which allows for easy control of the critical dimension (CD).

In some embodiments, to protect the dielectric material identified by reference number 2 a block mask 38 of an organic planarization layer (OPL) may be employed. The block mask 38 comprising the OPL material may be formed by blanket depositing a layer of OPL material, providing a patterned photoresist atop the layer of OPL material, and then etching the layer of material to provide a block mask 38. The organic planarization layer (OPL) layer 38 may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB). Following formation of the trenches for the second transistor gate cut structure 24, 29, 34, 39, the block mask may be removed using etching and/or chemical stripping.

Referring to FIG. 1, the trenches for the second transistor gate cut structure 24, 29, 34, 39 may then be filled with a dielectric material. The trenches for the second transistor gate cut structure 24, 29, 34, 39 may optionally be lined with a conventional liner material, e.g., a nitride, and then CVD or another like deposition process is used to fill the trench with another like dielectric material, e.g., an oxide, such as silicon oxide ($SiO_2$). A planarization process such as chemical-mechanical polishing (CMP) may optionally be used to provide a planar structure.

In a following process step, a backside interconnect may be formed. The backside interconnect layer identified by reference number 1 may include one or more metal lines, which may configured as metal lines and vias through a dielectric material.

Having described preferred embodiments of a methods and structures for stacked field effect transistors having a hybrid gate cut that are disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:

a stacked structure including a first vertically stacked channel region positioned over a second vertically stacked channel region;

at least one gate structure in electrical communication with the first vertically stacked channel region and the second vertically stacked channel region; and at least one two-component gate cut structure present adjacent to the gate structure, wherein a first component of the two-component gate cut structure is positioned adjacent to a first portion of the at least one gate structure, and a second component of the two-component gate cut structure is positioned adjacent to a second portion of the at least one gate structure, and wherein the first component of the two-component gate cut structure has a first width, and the second component of the two-component gate cut structure has a second width, wherein the first width is greater than the second width.

2. The semiconductor device of claim 1, wherein the first vertically stacked channel region and the second vertically stacked channel region have a mid dielectric layer positioned therebetween, wherein the first component of the two-component gate cut structure is present on a first side of the mid dielectric layer and the second component of the two-component gate cut structure is present on a second side of the mid dielectric layer.

3. The semiconductor device of claim 1, wherein each of the first component and the second component are comprised of at least one dielectric material.

4. The semiconductor device of claim 1, wherein the at least one two-component gate cut structure is present on each side of the gate structure.

5. The semiconductor device of claim 1, wherein a width of channel structures in the first vertically stacked channel region is less than a width of channel structures in the second vertically stacked channel region.

6. The semiconductor device of claim 1, wherein channel structures in one or more of a group of the first vertically stacked channel region and the second vertically stacked channel region are nanosheet semiconductor layers.

7. The semiconductor device of claim 2, wherein a portion of the first component of the two-component gate cut structure is in direct contact with the second component of the two-component gate cut structure.

8. The semiconductor device of claim 2, wherein a portion of the first component of the two-component gate cut structure and a portion of the second component of the two-component gate cut structure are in direct contact with the mid dielectric layer.

9. The semiconductor device of claim 1, wherein the first component of the two-component gate cut structure has a first taper, and the second component of the two-component gate cut structure has a second taper, wherein the first taper is opposite the second taper.

10. The semiconductor device of claim 1, wherein the first component of the at least one two-component gate cut structure has a first length, and the second component of the at least one two-component gate cut structure has a second length, wherein the first length is different from the second length.

11. A semiconductor device comprising:

a first transistor device stacked over a second transistor device, wherein a mid dielectric layer is positioned between the first transistor device and the second transistor device;

a first transistor side gate cut region that extends through an entirety of a gate structure for the first transistor device to the mid dielectric layer; and a second transistor side gate cut region that extends through an entirety of a gate structure for the second transistor device to the mid dielectric layer, wherein the first transistor side gate cut region has a first width, and the second transistor side gate cut region has a second width, wherein the first width is less than the second width.

12. The semiconductor device of claim 11, wherein the first transistor side gate cut region removes a gate extension from at least one side of nanosheets that provides at least one of the first transistor device and the second transistor device to enable independent gate devices.

13. The semiconductor device of claim 11, wherein the first transistor side gate cut region has a first taper, and the second transistor side gate cut region has a second taper, wherein the first taper is opposite the second taper.

14. The semiconductor device of claim 11, wherein the first transistor side gate cut region is composed of a first dielectric material, and the second transistor side gate cut region is composed of a second dielectric material, wherein the first dielectric material is a different composition than the second dielectric material.

15. A method of forming a semiconductor device comprising:

forming a vertical stack of two field effect transistors having a gate structure and channel structures;

forming a first field effect transistor gate cut from a first side of the vertical stack; and forming a second field effect transistor gate cut from a second side of the vertical stack, wherein the first side of the vertical stack and the second side of the vertical stack are opposite one another, and wherein the first field effect transistor gate cut has a first width, and the second field effect transistor gate cut has a second width, wherein the first width is greater than the second width.

16. The method of claim 15, wherein a mid dielectric layer is positioned in the vertical stack separating channel regions of a first field effect transistor of the two field effect transistors from channel structures of a second field effect transistor of the two field effect transistors, and the first field effect transistor gate cut extends from a first side of the vertical stack to a depth in the vertical stack that is level with the mid dielectric layer, and the second field effect transistor gate cut extends from a second side of the vertical stack to the depth in the vertical stack that is level with the mid dielectric layer.

17. The method of claim 16, wherein the vertical stack is positioned on a supporting substrate for forming the vertical stack of the two field effect transistors, the method further comprising removing the supporting substrate from the second side of the vertical stack prior to said forming the second field effect transistor gate cut.

18. The method of claim 16, further comprising reducing parasitic capacitance by forming nanosheets for channel regions of the first field effect transistor having a width that is less than a width for nanosheets for channel region of the second field effect transistor.

19. The method of claim 15, wherein the first field effect transistor gate cut has a first taper, and the second field effect transistor gate cut has a second taper, wherein the first taper is opposite the second taper.

20. The method of claim 15, wherein the first field effect transistor gate cut is composed of a first dielectric material, and the second field effect transistor gate cut is composed of a second dielectric material, wherein the first dielectric material is a different composition than the second dielectric material.

* * * * *